United States Patent
Menger et al.

(10) Patent No.: US 11,300,891 B2
(45) Date of Patent: *Apr. 12, 2022

(54) METHODS AND APPARATUS FOR CALCULATING SUBSTRATE MODEL PARAMETERS AND CONTROLLING LITHOGRAPHIC PROCESSING

(71) Applicant: ASML NETHERLANDS B.V., Veldhoven (NL)

(72) Inventors: Jasper Menger, Eindhoven (NL); Paul Cornelis Hubertus Aben, Eindhoven (NL); Everhardus Cornelis Mos, Best (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 17/111,050

(22) Filed: Dec. 3, 2020

(65) Prior Publication Data
US 2021/0191286 A1 Jun. 24, 2021

Related U.S. Application Data

(63) Continuation of application No. 16/665,022, filed on Oct. 28, 2018, now Pat. No. 10,859,930, which is a
(Continued)

(30) Foreign Application Priority Data

Dec. 12, 2014 (EP) .................................... 14197517

(51) Int. Cl.
*G03F 9/00* (2006.01)

(52) U.S. Cl.
CPC ................................ *G03F 9/7046* (2013.01)

(58) Field of Classification Search
CPC .............................. G03F 9/7046; G03F 7/705
See application file for complete search history.

(56) References Cited

U.S. PATENT DOCUMENTS 5,581,324 A 12/1996 Miyai et al.
7,271,907 B2 9/2007 Van Bilsen
(Continued)

FOREIGN PATENT DOCUMENTS

EP 1 775 635 4/2007
JP 2008-147654 6/2008
(Continued)

OTHER PUBLICATIONS

International Search Report and Written Opinion dated Apr. 18, 2016 in corresponding International Patent Application No. PCT/EP2015/076432.
(Continued)

*Primary Examiner* — Deoram Persaud
(74) *Attorney, Agent, or Firm* — Pillsbury Winthrop Shaw Pittman LLP

(57) ABSTRACT

Offline metrology measurements are performed on substrates that have been subjected to lithographic processing. Model parameters are calculated by fitting the measurements to an extended high-order substrate model defined using a combination of basis functions that include an edge basis function related to a substrate edge. A radial edge basis function may be expressed in terms of distance from a substrate edge. The edge basis function may, for example, be an exponential decay function or a rational function. Lithographic processing of a subsequent substrate is controlled using the calculated high-order substrate model parameters, in combination with low-order substrate model parameters obtained by fitting inline measurements to a low order model.

20 Claims, 9 Drawing Sheets

Related U.S. Application Data continuation of application No. 15/528,693, filed as application No. PCT/EP2015/076432 on Nov. 12, 2015, now Pat. No. 10,495,990.

(56) References Cited

U.S. PATENT DOCUMENTS

| | | |
|---|---|---|
| 7,595,496 B2 | 9/2009 | Ottens et al. |
| 7,683,351 B2 | 3/2010 | Mos et al. |
| 7,791,727 B2 | 9/2010 | Den Boef et al. |
| 8,236,133 B2 | 8/2012 | Katz et al. |
| 8,612,045 B2 | 12/2013 | Mos et al. |
| 8,874,249 B2 | 10/2014 | Ausschnitt |
| 8,976,355 B2 | 3/2015 | Van Der Sanden et al. |
| 9,177,219 B2 | 11/2015 | Tel et al. |
| 9,417,533 B2 | 8/2016 | Prosyentsov et al. |
| 9,792,675 B1 | 10/2017 | Lina et al. |
| 2004/0257545 A1 | 12/2004 | Brinkhof et al. |
| 2006/0033921 A1 | 2/2006 | Den Boef et al. |
| 2007/0082280 A1 | 4/2007 | Menchtchikov et al. |
| 2009/0272492 A1 | 11/2009 | Katz et al. |
| 2011/0010000 A1 | 1/2011 | Mos et al. |
| 2011/0196646 A1 | 8/2011 | Mos et al. |
| 2012/0008127 A1 | 1/2012 | Tel et al. |
| 2012/0191236 A1 | 7/2012 | Ausschnitt |
| 2012/0218533 A1 | 8/2012 | Lyulina et al. |
| 2013/0230797 A1 | 9/2013 | Van Der Sanden et al. |
| 2014/0065733 A1 | 3/2014 | Ausschnitt |
| 2016/0239708 A1 | 8/2016 | Krishnamoorthi et al. |
| 2016/0246185 A1 | 8/2016 | Ypma |
| 2016/0334717 A1 | 11/2016 | Wildenberg |

FOREIGN PATENT DOCUMENTS

| | | |
|---|---|---|
| KR | 10-2005-0098438 | 10/2005 |
| KR | 10-2007-0040744 | 4/2007 |
| TW | 201117259 | 5/2011 |
| WO | 2013/017924 | 2/2013 |

OTHER PUBLICATIONS

Zhang, Wangyang et al., "Efficient Spatial Pattern Analysis for Variation Decomposition Via Robust Sparse Regression", IEEE Transactions on Computer-Aided Design of Integrated Circuits and Systems, vol. 32, No. 7, pp. 1072-1085 (Jul. 2013).

Ferris-Prabhu, Albert V. et al., "Radial yield variations in semiconductor wafers", IEEE Circuits and Devices Magazine, vol. 3, No. 2, pp. 42-47 (1987).

Huang, Chun-Yen et al., "Overlay improvement by zone alignment strategy", Proceedings of SPIE—The International Society for Optical Engineering, vol. 6922, pp. 69221G-1 69221G-8 (2008).

Korean Office Action issued in corresponding Korean Patent Application No. 10-2017-7014765, dated Sep. 3, 2018.

Korean Office Action issued in corresponding Korean Patent Application No. 10-2019-7017232, dated Feb. 8, 2021.

METHODS AND APPARATUS FOR CALCULATING SUBSTRATE MODEL PARAMETERS AND CONTROLLING LITHOGRAPHIC PROCESSING

This application is a continuation of U.S. patent application Ser. No. 16/665,022, filed on Oct. 28, 2019, now allowed, which is a continuation of U.S. patent application Ser. No. 15/528,693, filed on May 22, 2017, now U.S. Pat. No. 10,495,990, which is the U.S. national phase entry of PCT patent application No. PCT/EP2015/076432, filed on Nov. 12, 2015, which claims the benefit of priority of European patent application no. 14197517.7, filed on Dec. 12, 2014, each of the foregoing applications is incorporated herein in its entirety by reference.

FIELD

This description relates to methods and apparatus for calculating substrate model parameters, to methods and apparatus for controlling lithographic processing and to computer program products for implementing such methods and apparatus. The substrate model parameters can be used for example in models for correcting errors of overlay and alignment in lithographic processing.

BACKGROUND

A lithographic process is one in which a lithographic apparatus applies a desired pattern onto a substrate, usually onto a target portion of the substrate, after which various processing chemical and/or physical processing steps work through the pattern to create functional features of a complex product. The accurate placement of patterns on the substrate is a chief challenge for reducing the size of circuit components and other products that may be produced by lithography. In particular, the challenge of measuring accurately the features on a substrate which have already been laid down is a critical step in being able to position successive layers of features in superposition accurately enough to produce working devices with a high yield. So-called overlay should, in general, be achieved within a few tens of nanometers in today's sub-micron semiconductor devices, down to a few nanometers in the most critical layers.

Consequently, modern lithography apparatuses involve extensive measurement or 'mapping' operations prior to the step of actually exposing or otherwise patterning the substrate at a target location. In the following discussion, the substrate will be referred to for convenience as a "wafer", without implying any limitation to the types of substrate that may be processed using an embodiment of the invention. Advanced substrate models, for example alignment models, have been, and continue to be, developed to model and correct more accurately non-linear distortions of the wafer grid that are caused by processing steps and/or by the lithographic apparatus itself. The expression wafer grid is used to refer to a coordinate system that is formed by the (measured) alignment marks at the wafer. For example, a wafer grid is formed by the alignment marks in the scribe lanes of the wafer, that in the ideal case form an orthogonal grid.

BRIEF SUMMARY

Alignment model parameters are calculated in order to fit an alignment model to measurements of structures on substrates. Overlay and alignment error on production wafers as function of a position on the wafer can described by means of alignment models. These alignment models are used in automatic process control (APC) systems to control lithographic processes to correct for overlay and alignment errors. However, it has been found that even with such correction, there is still yield loss at the edge of the wafer. To correct this yield loss using known modeling techniques would introduce a high burden on measurement and on computation.

It has been recognized that substrate models can be improved to address localized effects at the substrate edge, without undue increase in computational or measurement overhead.

In an aspect, there is provided a method of calculating a substrate model for use in controlling a lithographic process, the method comprising:

defining a substrate model for representing disturbances of features on substrate to which patterns are to be applied by the lithographic process, the substrate model being defined as a combination of predefined basis functions;

receiving measurements of structures on at least one substrate; and calculating substrate model parameters using the measurements and the basis functions, wherein the basis functions include at least one edge basis function for representing effects related to a substrate edge.

In an aspect, there is provided an apparatus for calculating a substrate model for use in controlling a lithographic process, the apparatus comprising a data processing apparatus programmed to perform the steps of:

defining a substrate model for representing disturbances of features on substrate to which patterns are to be applied by the lithographic process, the substrate model being defined as a combination of predefined basis functions;

receiving measurements of structures on at least one substrate; and calculating substrate model parameters using the measurements and the basis functions, wherein the basis functions include at least one edge basis function for representing effects related to a substrate edge.

In an aspect, there is provided a method of controlling lithographic processing in which patterns are applied to substrates, the method comprising:

receiving first measurements of structures on substrates that have been subjected to lithographic processing;

using the first measurements of disturbances to calculate first substrate model parameters using the method described above or the apparatus described above; and controlling lithographic processing of a subsequent substrate using the calculated first substrate model parameters.

The step of controlling lithographic processing of the subsequent substrate may comprise:

receiving second measurements of disturbances on the subsequent substrate, the second measurements having a lower number per substrate than the first measurements;

using the second measurements to calculate second substrate model parameters of the subsequent substrate using a model having a lower order than a model used to calculate the first substrate model parameters; and controlling lithographic processing of the subsequent substrate using the calculated first substrate model parameters in combination with the second substrate model parameters.

In an aspect, there is provided an apparatus for controlling lithographic processing in which substrates are subjected to lithographic processing, the apparatus comprising a data processing apparatus programmed to perform the steps of:

receiving first measurements of disturbances on substrates that have been subjected to lithographic processing;

using the first measurements to calculate first substrate model parameters using the method described above or the apparatus described above; and controlling lithographic processing of a subsequent substrate using the calculated first substrate model parameters.

The step of controlling lithographic processing of the subsequent substrate may comprise:

receiving second measurements of disturbances on the subsequent substrate, the second measurements having a lower number per substrate than the first measurements;

using the second measurements to calculate second substrate model parameters of the subsequent substrate using a model having a lower order than a model used to calculate the first substrate model parameters; and controlling lithographic processing of the subsequent substrate using the calculated first substrate model parameters in combination with the second substrate model parameters.

In an aspect, there is provided a method of controlling lithographic processing, the method comprising:

calculating substrate model parameters using the method described above or the apparatus described above; and controlling lithographic processing using the calculated substrate model parameters.

In an aspect, there is provided an apparatus for controlling lithographic processing, the apparatus comprising a data processing apparatus programmed to perform the steps of:

calculating substrate model parameters using the method described above or the apparatus described above; and controlling lithographic processing using the calculated substrate model parameters.

In an aspect, there is provided a computer program product comprising machine readable instructions for causing a general purpose data processing apparatus to perform the steps of the method as described above or to implement the apparatus described above.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which.

DETAILED DESCRIPTION OF EXEMPLARY EMBODIMENTS

Figure 1:
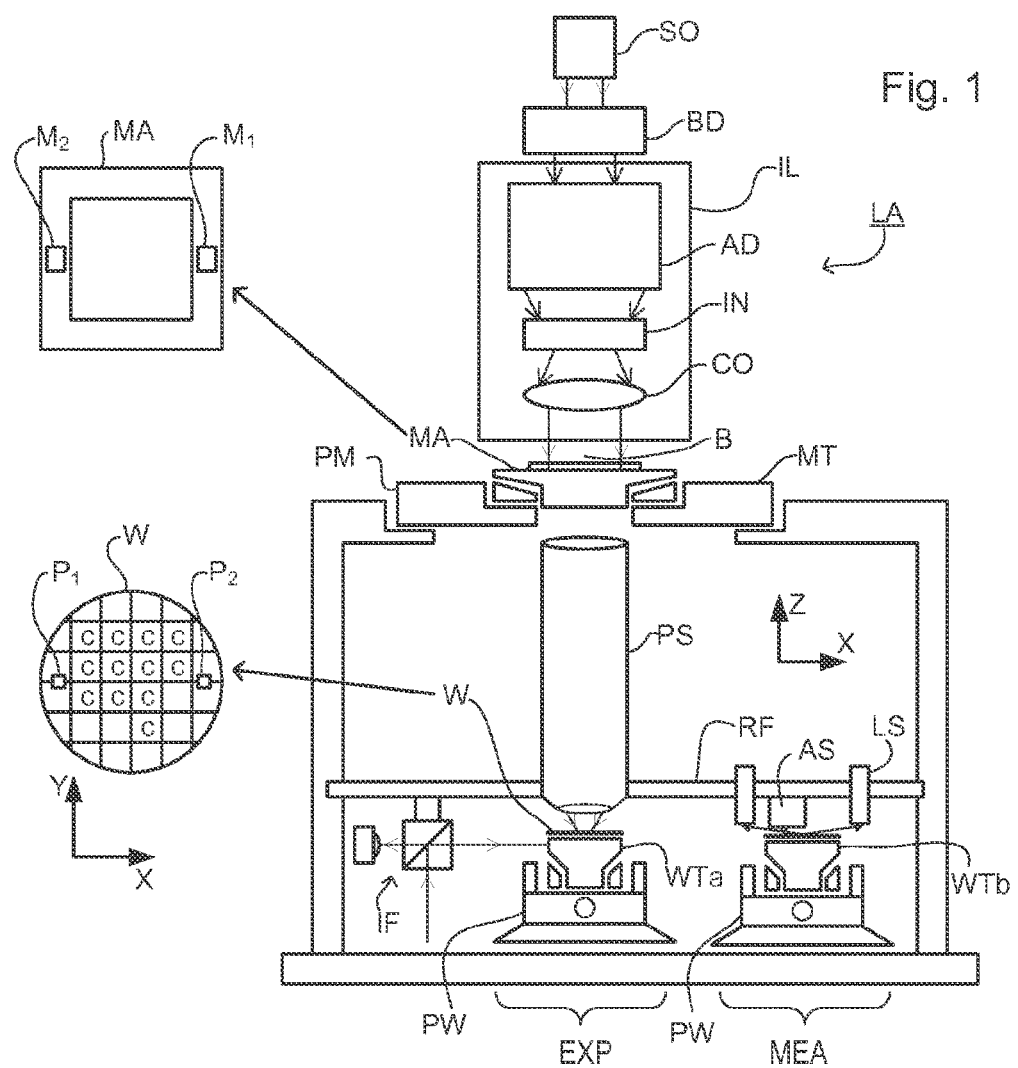
FIG. 1 depicts a lithographic apparatus according to an embodiment of the invention.

FIG. 1 schematically depicts a lithographic apparatus LA. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WTa or WTb constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a level sensor LS and measuring the position of alignment marks on the substrate using an alignment sensor AS. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus LA is to print product features at the correct locations with very high accuracy. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
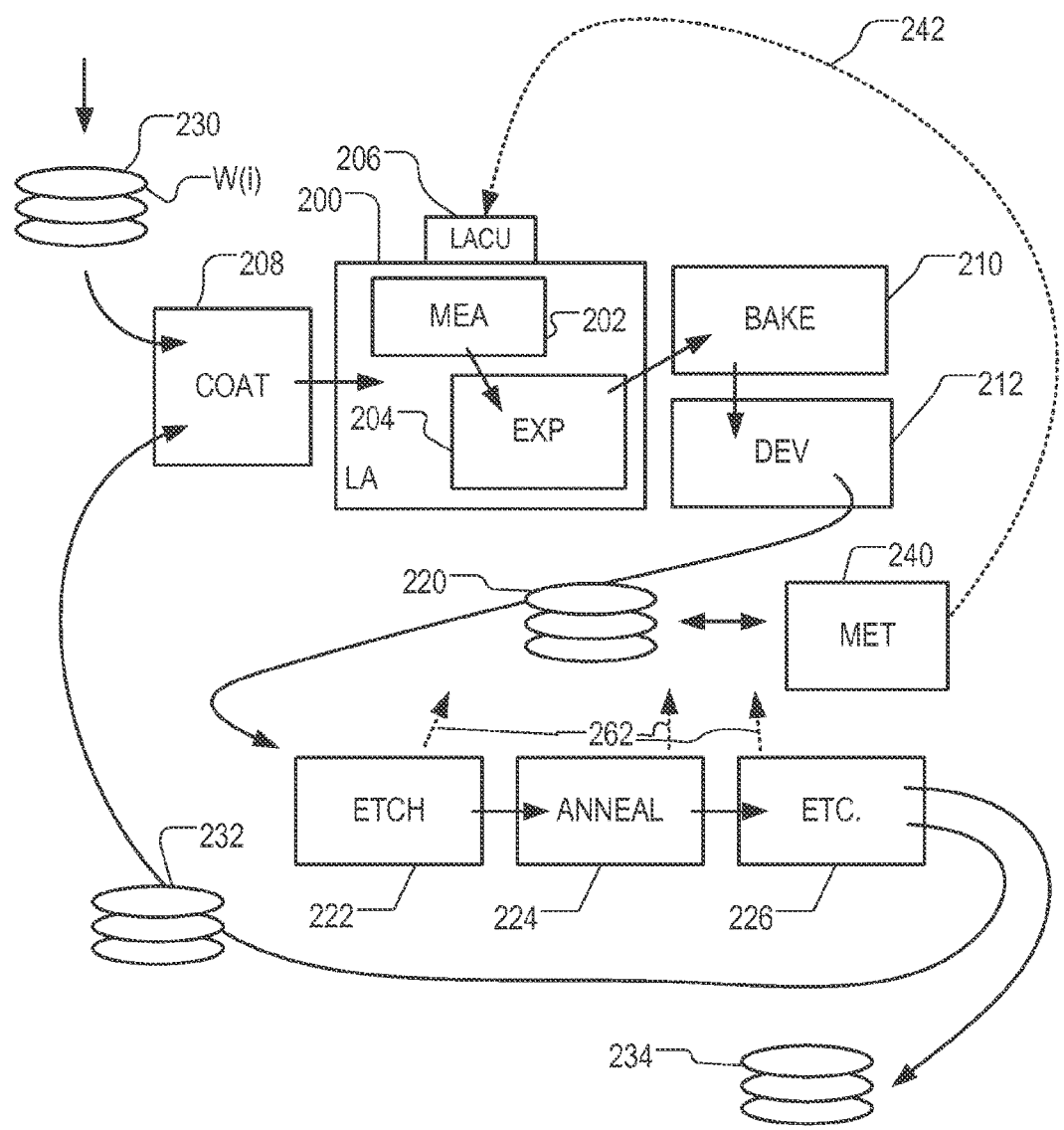
FIG. 2 shows schematically the use of the lithographic apparatus of FIG. 1 together with other apparatuses forming a production facility for semiconductor devices.

FIG. 2 at 200 shows the lithographic apparatus LA in the context of an industrial production facility for semiconductor products. Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that contains also a coating apparatus 208 for applying photosensitive resist and other coatings to substrate W for patterning by the apparatus 200. At the output side of apparatus 200, a baking apparatus 210 and developing apparatus 212 are provided for developing the exposed pattern into a physical resist pattern.

Once the pattern has been applied and developed, patterned substrates 220 are transferred to other processing apparatuses such as are illustrated at 222, 224, 226. A wide range of processing steps is implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be required to make a real device, such as deposition of material, modification of surface material characteristics (oxidation, doping, ion implantation etc.), chemical-mechanical polishing (CMP), and so forth. The apparatus 226 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 226 used at each layer may be completely different in type. Further, even where the processing steps to be applied by the apparatus 226 are nominally the same, in a large facility, there may be several supposedly identical machines working in parallel to perform the step 226 on different substrates. Small differences in set-up or faults between these machines can mean that they influence different substrates in different ways. Even steps that are relatively common to each layer, such as etching (apparatus 222) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

Also shown in FIG. 2 is a metrology apparatus 240 which is provided for making measurements of parameters of the products at desired stages in the manufacturing process. A common example of a metrology station in a modern lithographic production facility is a scatterometer, for example an angle-resolved scatterometer or a spectroscopic scatterometer, and it may be applied to measure properties of the developed substrates at 220 prior to etching in the apparatus 222. Using metrology apparatus 240, it may be determined, for example, that important performance parameters such as overlay or critical dimension (CD) do not meet specified accuracy requirements in the developed resist. Prior to the etching step, the opportunity exists to strip the developed resist and reprocess the substrates 220 through the litho cluster. As is also well known, the metrology results 242 from the apparatus 240 can be used to maintain accurate performance of the patterning operations in the litho cluster, by control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

Figure 3:
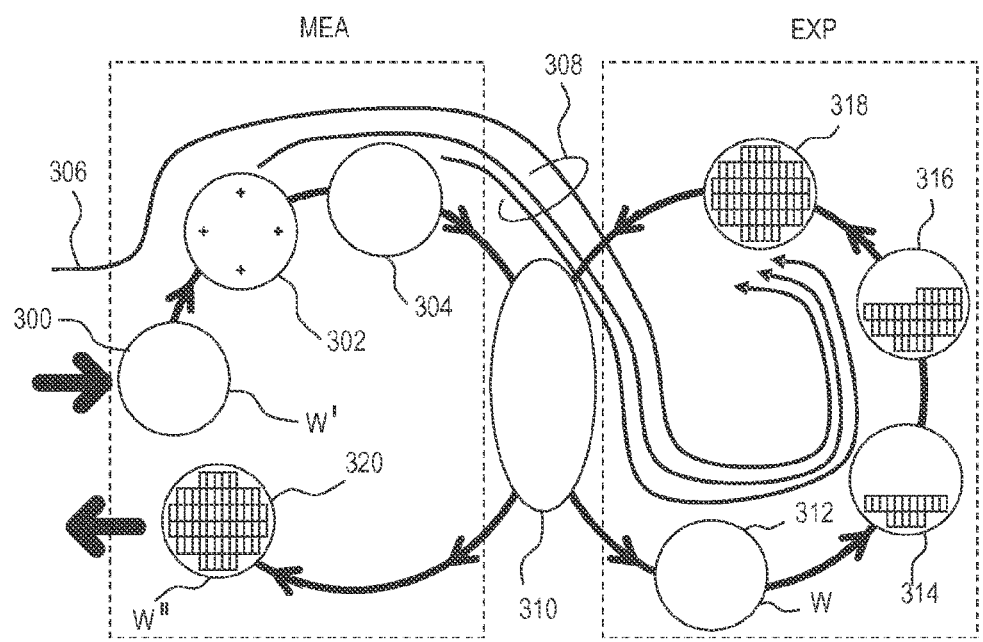
FIG. 3 illustrates schematically measurement and exposure processes in the apparatus of FIG. 1.

FIG. 3 illustrates the steps to expose target portions (e.g. die) on a substrate W in the dual stage apparatus of FIG. 1.

On the left hand side within a dotted box are steps performed at a measurement station MEA, while the right hand side shows steps performed at the exposure station EXP. From time to time, one of the substrate tables WTa, WTb will be at the exposure station, while the other is at the measurement station, as described above. For the purposes of this description, it is assumed that a substrate W has already been loaded into the exposure station. At step 300, a new substrate W' is loaded to the apparatus by a mechanism not shown. These two substrates are processed in parallel in order to increase the throughput of the lithographic apparatus.

Referring initially to the newly-loaded substrate W', this may be a previously unprocessed substrate, prepared with a new photo resist for first time exposure in the apparatus. In general, however, the lithography process described will be merely one step in a series of exposure and processing steps, so that substrate W' has been through this apparatus and/or other lithography apparatuses, several times already, and may have subsequent processes to undergo as well. Particularly for the problem of improving overlay performance, the task is to ensure that new patterns are applied in exactly the correct position on a substrate that has already been subjected to one or more cycles of patterning and processing. These processing steps progressively introduce distortions in the substrate that must be measured and corrected for, to achieve satisfactory overlay performance.

At 302, alignment measurements using the substrate marks P1 etc. and sensors (not shown) are used to measure and record alignment of the substrate relative to substrate table WTa/WTb. In addition, several alignment marks across the substrate W' will be measured using alignment sensor AS. These measurements are used in one embodiment to establish a so-called wafer grid, which maps very accurately the spatial distribution of alignment marks across the substrate, including any distortion relative to a nominal rectangular grid. In other words, the measurements record positional deviations of points on the substrate, relative to their ideal location.

At step 304, a map of wafer height (Z) against X-Y position is measured also using the level sensor LS. The height map is used to achieve accurate focusing of the exposed pattern. Again, the measurements record positional deviations of points on the substrate in the Z direction, relative to an ideal (flat) substrate.

When substrate W' was loaded, recipe data 306 were received, defining the exposures to be performed, and also properties of the wafer and the patterns previously made and to be made upon it. Recipe data 306 may also include high-order alignment model parameters obtained from previous metrology measurements. To these recipe data are added the measurements of wafer position, wafer grid and height map that were made at 302, 304, so that a complete set of recipe data and measurement data 308 can be passed to the exposure station EXP. The measurements of alignment data for example comprise X and Y positions of alignment targets formed in a fixed or nominally fixed relationship to the product patterns that are the product of the lithographic process. These alignment data, taken just before exposure, are combined and interpolated to provide parameters of an alignment model. These parameters and the alignment model will be used during the exposure operation to correct positions of patterns applied in the current lithographic step. A conventional alignment model might comprise four, five or six parameters, together defining translation, rotation and scaling of the 'ideal' grid, in different dimensions. As described further in U.S. patent application publication no. US 2013-230797, advanced models are known that use more parameters.

In this regard, the present description refers primarily to so-called "interfield" substrate models, which describe positional deviations that are characteristic of locations across the substrate. In a real process, it is common also to model "intrafield" variations that are characteristic of locations within each field (target portion C). To determine the final position of applying a pattern, the interfield model and intrafield model can be combined in a well-known manner.

At 310, wafers W' and W are swapped, so that the measured substrate W' takes on the role of the substrate W, to be exposed as discussed previously, entering the exposure station EXP. In the example apparatus of FIG. 1, this swapping is performed by exchanging the supports WTa and WTb within the apparatus, so that the substrates W, W' remain accurately clamped and positioned on those supports, to preserve relative alignment between the substrate tables and substrates themselves. The wafer W that has actually been exposed is removed and the relevant support will receive a new substrate (not shown) for being subjected to the measurements. Accordingly, once the tables have been swapped, determining the relative position between projection system PS and substrate table WTb (formerly WTa) is all that is necessary to make use of the measurement information 302, 304 for the substrate W (formerly W') in control of the exposure steps. At step 312, reticle alignment is performed using the mask alignment marks M1, M2. In steps 314, 316, 318, scanning motions and radiation pulses are applied at successive target locations across the substrate W, in order to complete the exposure of a number of patterns.

By using the alignment data and height map, as obtained at the measuring station, in the performance of the exposure steps, these patterns are accurately aligned with respect to the desired locations, and, in particular, with respect to features previously laid down on the same substrate. The exposed substrate, now labeled W'' is unloaded from the apparatus at step 320, to undergo etching or other processes, in accordance with the exposed pattern.

Figures 4A, 4B:
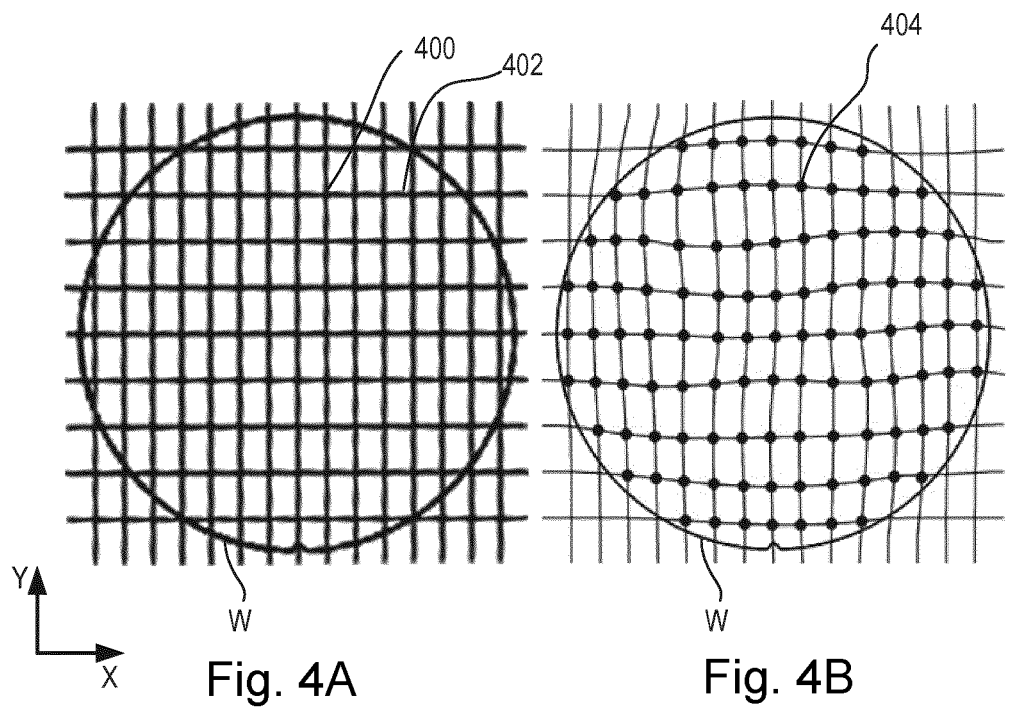
FIGS. 4A to 4C illustrate alignment information being used to correct for wafer grid distortion.
Figure 4C:
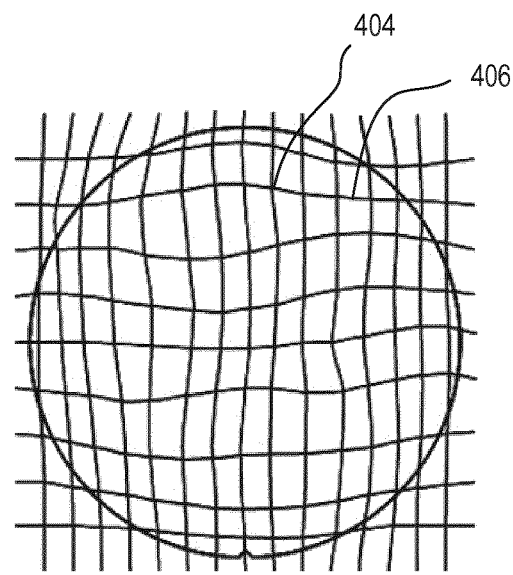

FIGS. 4A to 4C illustrate the form of alignment information that can be used to correct for wafer grid distortion as measured by the alignment sensor AL on alignment marks (targets) 400 in a previous layer on wafer (substrate) W. As shown in FIG. 4A, each target has a nominal position, defined usually in relation to a regular, rectangular grid 402 with axes X and Y. With reference to FIG. 4B, measurements of the real position 404 of each target reveal deviations from the nominal grid. The alignment marks may be provided within device areas of the substrate, and/or they may be provided in so-called "scribe lane" areas between device areas.

With reference to FIG. 4C, the measured positions 404 of all the targets can be processed numerically to set up a model of a distorted wafer grid 406 for this particular wafer. This alignment model is used in the patterning operation to control the position of the patterns applied to the substrate. In the example illustrated, the straight lines of the nominal grid have become curves. For such a case, a higher-order (advanced) alignment model can be used instead of with a linear alignment model. It goes without saying that the distortions illustrated are exaggerated compared to the real situation.

Even when advanced alignment models are used, errors inevitably remain in the overlay performance of the lithographic apparatus. An individual lithographic apparatus may also perform differently than other ones processing the same substrate. In order that the substrates that are exposed by the lithographic apparatus are exposed correctly and consistently, it is desirable to inspect exposed substrates to measure performance parameters such as overlay errors between subsequent layers, line thicknesses, critical dimensions (CD), etc.

An inspection apparatus is therefore used to determine the properties of the substrates independently of the alignment sensors AS, and in particular, how the properties of different substrates or of different layers of the same substrate vary from layer to layer. The inspection apparatus (not shown in FIG. 3, but shown in FIG. 2 at 240) may be integrated into the lithographic apparatus LA or the lithocell LC or may be a stand-alone device. It may be a scatterometer, for example an angle-resolved scatterometer of the time described in published US patent application publication no. US 2006-033921.

The inspection apparatus can also be used in an advanced process control (APC) system to calibrate individual lithographic apparatus and to allow different tools to be used more interchangeably. Improvements to the apparatus's focus and overlay (layer-to-layer alignment) uniformity have recently been achieved by the implementation of a stability module, leading to an optimized process window for a given feature size and chip application, enabling the continuation the creation of smaller, more advanced chips. The stability module in one embodiment automatically resets the system to a pre-defined baseline at regular intervals, for example each day. More detail of lithography and metrology methods incorporating the stability module can be found in US2012008127A1. The known example implements three main process control loops. The first loop provides the local control of the lithography apparatus using the stability module and monitor wafers. The second (APC) loop is for local scanner control on-product (determining focus, dose, and overlay on product wafers).

The third control loop is to allow metrology integration into the second (APC) loop (e.g., for double patterning). All of these loops use measurements made by the inspection apparatus 240 in FIG. 2, in addition to the measurements made during the actual patterning operations of FIG. 3.

As mentioned above, standard alignment models may have six parameters (effectively three per direction X & Y) and in addition there are more advanced alignment models. On the other hand, for the most demanding processes currently in use and under development, to achieve the desired overlay performance requires more detailed corrections of the wafer grid. While standard models might use fewer than ten parameters, advanced alignment models typically use more than 15 parameters, or more than 30 parameters. Examples of advanced models are higher order wafer alignment (HOWA) models, zone-alignment (ZA) and radial basis function (RBF) based alignment models. HOWA is a published technique based on second, third and higher order polynomial functions. Zone alignment is described for example in Huang et al, "Overlay improvement by zone alignment strategy", Proc. SPIE 6922, 69221G (2008). RBF modeling is described in U.S. patent application publication no. 2012/0218533. The advanced models generate a complex description of the wafer grid that is corrected for, during the exposure of the target layer. RBF and latest versions of HOWA provide particularly complex descriptions based on tens of parameters. This implies a great many measurements are required to obtain a wafer grid with sufficient detail.

Figure 5:
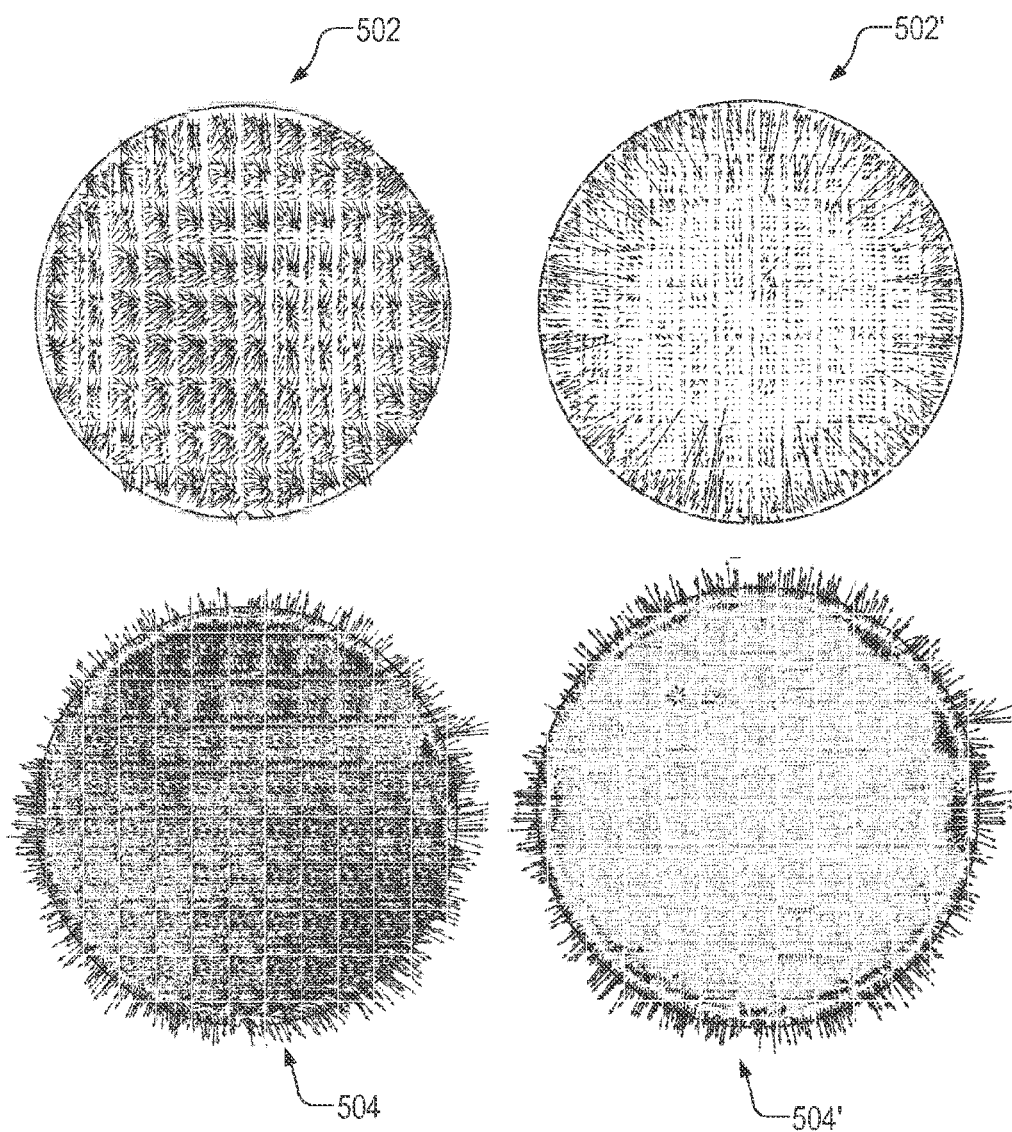
FIG. 5 illustrates examples of alignment errors and residuals for two example multi-wafer lots, with arrows indicating the direction of alignment errors.

It has been observed that, in some processes, the alignment and overlay error radically increases in magnitude towards the edge of the wafer. FIG. 5 shows plots 502 and 504 of uncorrected overlay errors in two different example products. The arrows indicate the direction of alignment errors. The direction of error may be either inwards or outwards, depending on the root cause and/or measurement convention (e.g. upper layer to lower layer alignment or vice versa). The edge effect is clearly visible in FIG. 5. Moreover, plots 502' and 504' show residual errors ("residuals") for the same products after fitting with an interfield polynomial model and an intrafield polynomial model. (The residuals are not necessarily on the same scale as the original errors). That is to say, the residuals in plots 502' 504' represent errors that remain uncorrected even after application of modern high-order correction models. At the edges of the wafers the magnitude of the arrows is larger and the direction can point radially inwards 502 or radially outwards 504. Thus it can be seen from the residuals that fitting with a 5th order interfield polynomial is not sufficient for capturing the edge effect. Similarly, other known advanced high-order alignment models cannot adequately describe the edge effect.

Figure 6A:
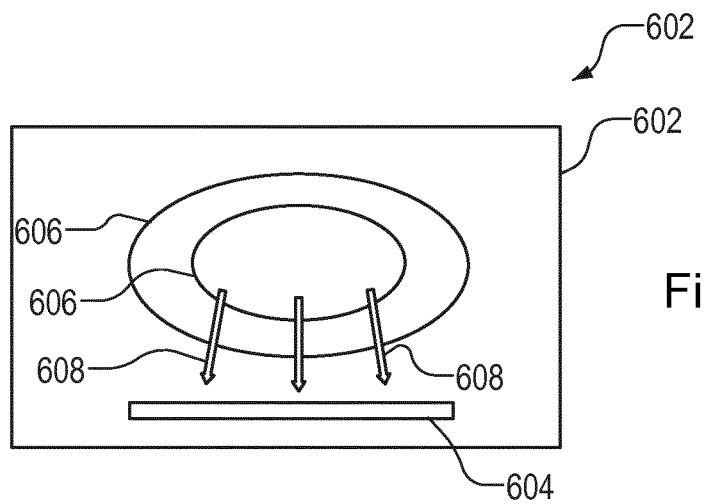
FIGS. 6A to 6C illustrate examples of root causes and the effect on overlay of wafer edge effects.
Figure 6B:
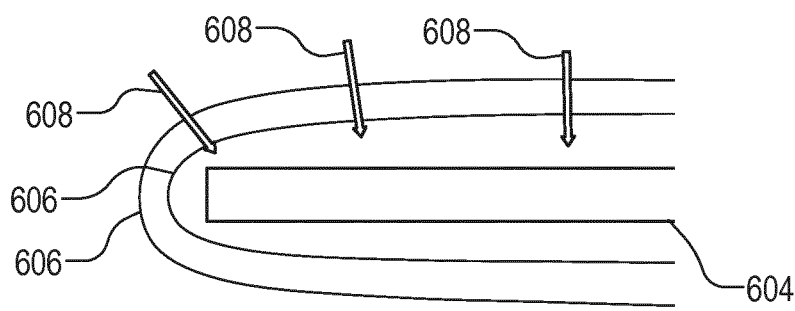
Figure 6C:
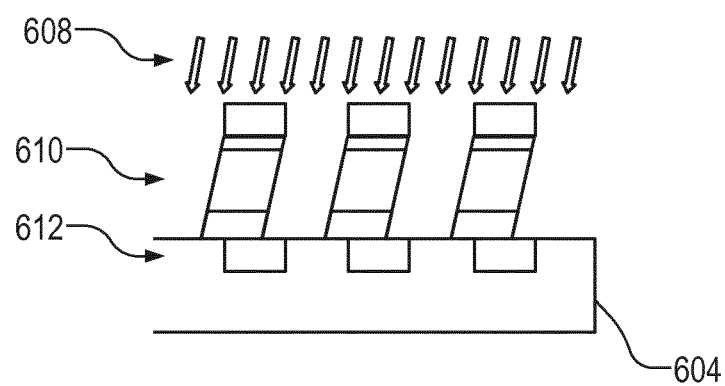

FIGS. 6A to 6C illustrate some possible root causes and effect on overlay of wafer edge effects. Most likely the edge disturbances in the illustrated examples are caused by a curvature in an electrical field during dry etching. In this type of etching, ions are moved under the electric field to bombard the material to be etched. A cross-section of the wafer and etching environment are shown in FIG. 6. As shown in FIG. 6A, both the etch chamber 602 and wafer 604 are finite in size. Iso-potential lines 606 (lines of equal electric potential) will not be parallel to the wafer surface close to the edge, causing ions 608 to bombard the surface in a non-perpendicular direction (see detail at FIG. 6B). The iso-potential lines in the two-dimensional cross-section stem from two-dimensional iso-potential surfaces in the three-dimensional scene. The etched multi-layered structures 610 shown at FIG. 6C are slanted, and thus not neatly aligned to the underlying layer structures 612.

Current alignment models are not able to accurately describe this effect. Known automatic process control (APC) systems will not be able to detect such edge disturbances, therefore it will not raise appropriate alarms, nor adequately correct for these edge disturbances. As a consequence, the ability to improve yield of edge dies using APC systems is adversely affected by this edge effect.

A simple solution would be to increase the maximal fit order of current state of the art polynomial models. But since none of those high-order basis functions do correlate particularly well with the edge disturbance, many additional degrees of freedom (for example $10^{th}$-order polynomials) would be needed in order to obtain sufficient accuracy. As a consequence such models require many more measurement points and/or will be much more sensitive to noise. Furthermore, those extra basis functions and coefficients do not offer extra insight into the disturbance root cause.

The existing models for alignment and overlay can be extended in a more efficient manner to provide methods of calculating alignment model parameters to overcome the problems discussed above. In such extended alignment and overlay models, the disturbance represented by the model may be a positional deviation. The extended models are also envisioned to be applicable to other lithographic patterning characteristics such as, but not limited to, critical dimension (CD), focus and sidewall angle (SWA), because the substrate-edge-related disturbances for these characteristics have a similar root cause. Therefore the present disclosure makes reference to substrate models, which include alignment models, CD models, focus models and SWA models. Substrate models are used to model disturbances introduced in lithographic processing, and can represent the "fingerprint" or pattern of disturbance of a particular lithographic process or process step across a substrate. These disturbances include, but are not limited to alignment (positional deviations in the plane of the substrate), height deviations (normal to the plane), CD, focus and SWA.

In the proposed extended models, the interfield overlay disturbances may be described in terms of their radial & tangential (R&T) components as seen from the wafer center, rather than the traditional Cartesian (X&Y) orientations in which the measurements are delivered.

A semiconductor wafer is generally circular, although it may have a small flattened section or notch (seen in FIG. 4, for example) for alignment. If R is the distance from the center of the wafer to the edge and r is the distance of a point from the center of the wafer, then let t=R−r be the distance from the wafer edge for any given exposure field. More generally, the principles of the present disclosure may be applied in processing rectangular substrates, or other non-circular substrates. Depending on the substrate shape, and on the processing effects which are to be modeled, a different coordinate system may be adopted to express the distance from the substrate edge.

According to principles of the present disclosure, one or more specific edge-related basis functions are added to the interfield substrate model that are designed to be more capable of describing the edge effect. Substrate model parameters are thus calculated using a combination of basis functions, the basis functions including at least one edge basis function related to a substrate edge.

Let u(t) be the edge basis function (typically having units of nanometers). Various functions can be considered as suitable for use as edge basis functions related to a substrate edge. An exponential decay function may be defined:

$$u(t)=C \cdot 2^{-t/\lambda}$$

with $\lambda$ being a half-life decay distance or decay range parameter and C being the amplitude at the edge.

Another example is a rational function:

$$u(t)=C_1/t+C_2/t^2$$

with $C_1$ and $C_2$ being shape constants.

When using a rational function as a basis function, as in the second example above, care should be taken to avoid "divide-by-zero" errors. Using the simple formula above, u(t) will be infinity when "t" approaches zero. In a practical implementation, therefore, some modification of the formula is used to avoid excessive values, and to avoid computational error conditions. In one such implementation we use the terms of the form C/(t+δ) in place of C/t, where δ is a small offset effective to avoid dividing by zero at the wafer edge. (Alternatively, and equivalently, one can calculate t by reference to a radius R that is slightly larger than the true radius of the substrate.) Alternatively, one could apply a rule whereby the rational function is used only to values of "t" larger than a minimum value δ larger than zero. A variety of measures can be envisaged.

In another example, δ may be used as one of the variable parameters of the edge effect model. For example, a function $$u(t)=C_1/(t+\delta)$$

can be envisaged, with C1 and δ in the role of shape constants. A further term

It will be noted that these example edge basis functions are basis functions having one or more contributions expressed in terms of distance from the wafer edge, t. In the exponential decay functions, one or more terms have the distance from the edge as exponent. In the example rational functions, one or more terms have the distance from the edge in a denominator. These forms can be combined and/or other edge basis functions may be used. A feature of these examples is that their effect can be limited to an arbitrarily narrow edge area of the substrate, i.e., to a surface area of the substrate that is bounded by the substrate's perimeter and that has a radial width much smaller than the radius of the substrate. Accordingly, the edge basis functions enable to take into account the spatial dependence of a specific one of the disturbances related to only an area of the substrate near an edge of the substrate. In this way it does not disrupt the definition and fitting of the interfield model across the substrate as a whole. It will also be noted that each example introduces only two additional degrees of freedom to the model. Consequently the additional computational complexity is minimized, and the additional measurement burden is avoided.

The example edge basis functions given above also have the property that they are functions whose value decreases monotonically from the substrate edge. As known, a mathematical function F is called "monotonically decreasing" if, whenever p≤q, then F(p)≥F(q). Functions having such a property can be used to model the typical effects arising at the edge of a substrate in processing situations such as the etching operation of FIG. 6.

Distance from the edge is defined in the above examples as radial distance, relative to a circular substrate. The appropriate definition of distance from the edge in a given situation can be determined from the geometry of the substrate and the nature of the edge-related processing effects.

Figure 7:
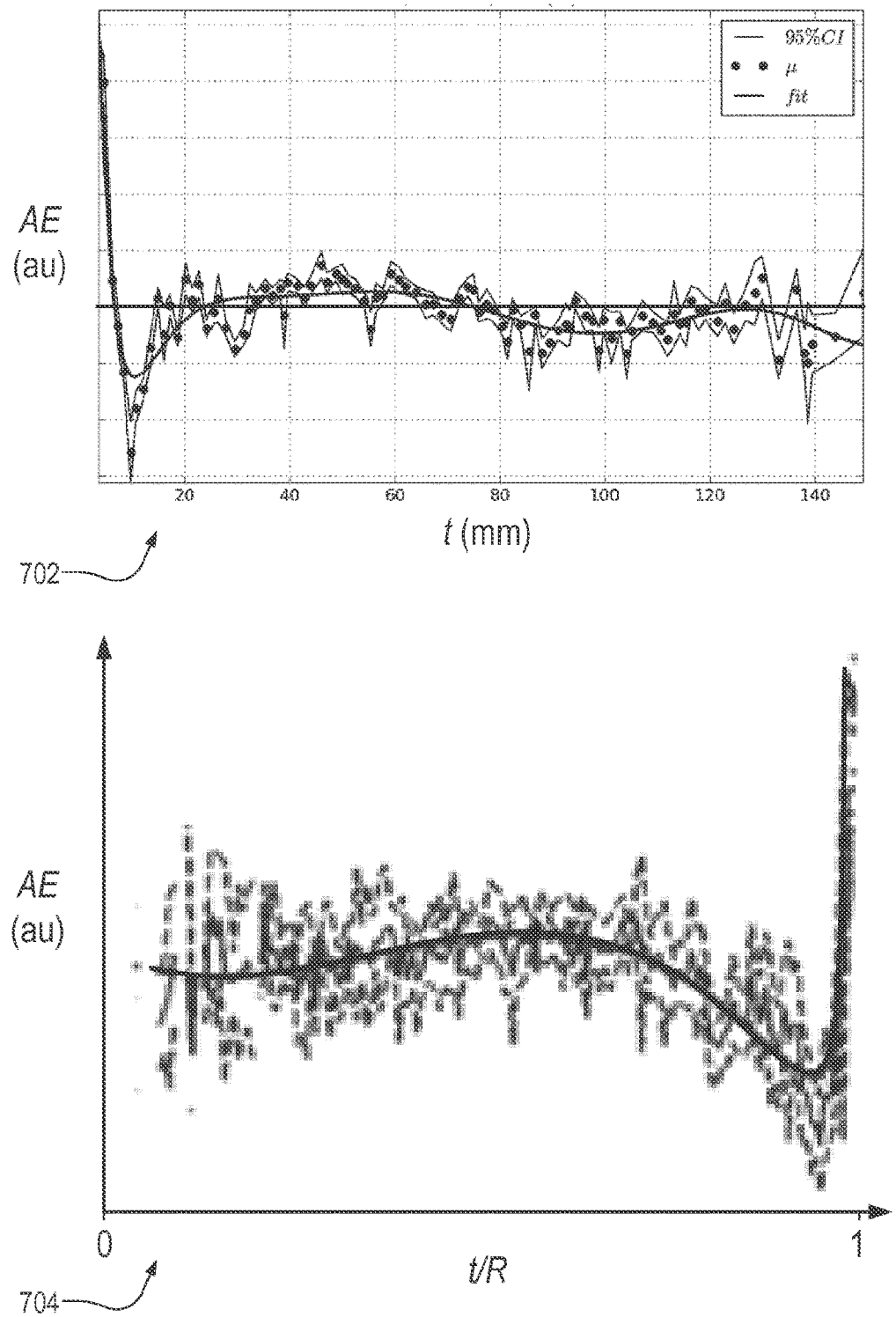
FIG. 7 illustrates graphs of radial alignment error versus distance from the wafer edge with fitted models having parameters calculated in accordance with embodiments of the present invention.

FIG. 7 illustrates graphs of radial alignment error versus distance from the wafer edge, compared with fitted models having parameters calculated in accordance with embodiments of the present disclosure. FIG. 7 shows how these edge basis functions (when used together with conventional polynomial basis functions) are capable of describing the average radial trend without straying beyond the 95% confidence interval (CI) shown by the solid non-smooth lines. 702 is a graph showing application of an exponential decay function with dots for the data points. 704 is a graph showing application of a rational function. The rational function is shown as a solid line, with a dashed line for the data points. In FIG. 7, the vertical axis is the radial alignment error AE (in arbitrary units) and the horizontal axis is respectively distance from the wafer edge, t, (in mm) or normalized with respect to R, i.e. t/R. The fit line is shown as a smooth solid line in both graphs. This good fit illustrates that systematic edge effects are captured with minimal computational expense.

The exponential decay and rational edge basis functions described above have only two (additional) degrees of freedom. The result is an improved alignment performance, without significantly changing the noise suppression of the fit. This makes the extended substrate models very well suited for use cases that have a sparse sampling layout, such as wafer alignment and inline metrology.

The extended substrate model for overlay is able to capture the slanted etch-induced alignment error close to the wafer edge. Such a model can be implemented in a controller application, such as used in the controller LACU of FIG. 2 and/or any advanced process control application. The lithographic system is thus able to detect these disturbances, and if desired correct for them to the best of the available lithographic apparatus actuator capabilities. Alarm signals and other diagnostic information can also be derived from the edge-related parameters, which would not be available in a model where edge effects are not specifically recognized.

Optionally, the extended substrate model may represent disturbances in a selected direction in the plane of the substrate. For example, for an alignment model the extended model may be used for only one of the two overlay directions X and Y, or may represent each in a separate model. This may be applicable in lithographic layers where X-overlay and Y-overlay are measured to a different underlying layer. Only one of the layers might be susceptible to an edge effect. The extended model may be selectively enabled or disabled simply, to suit different situations. To disable the extended model, the edge basis functions can simply be omitted from the calculations, or the edge-related related parameters can be substituted with zero (or whatever value is appropriate to produce zero contribution in the overall model).

Figure 8:
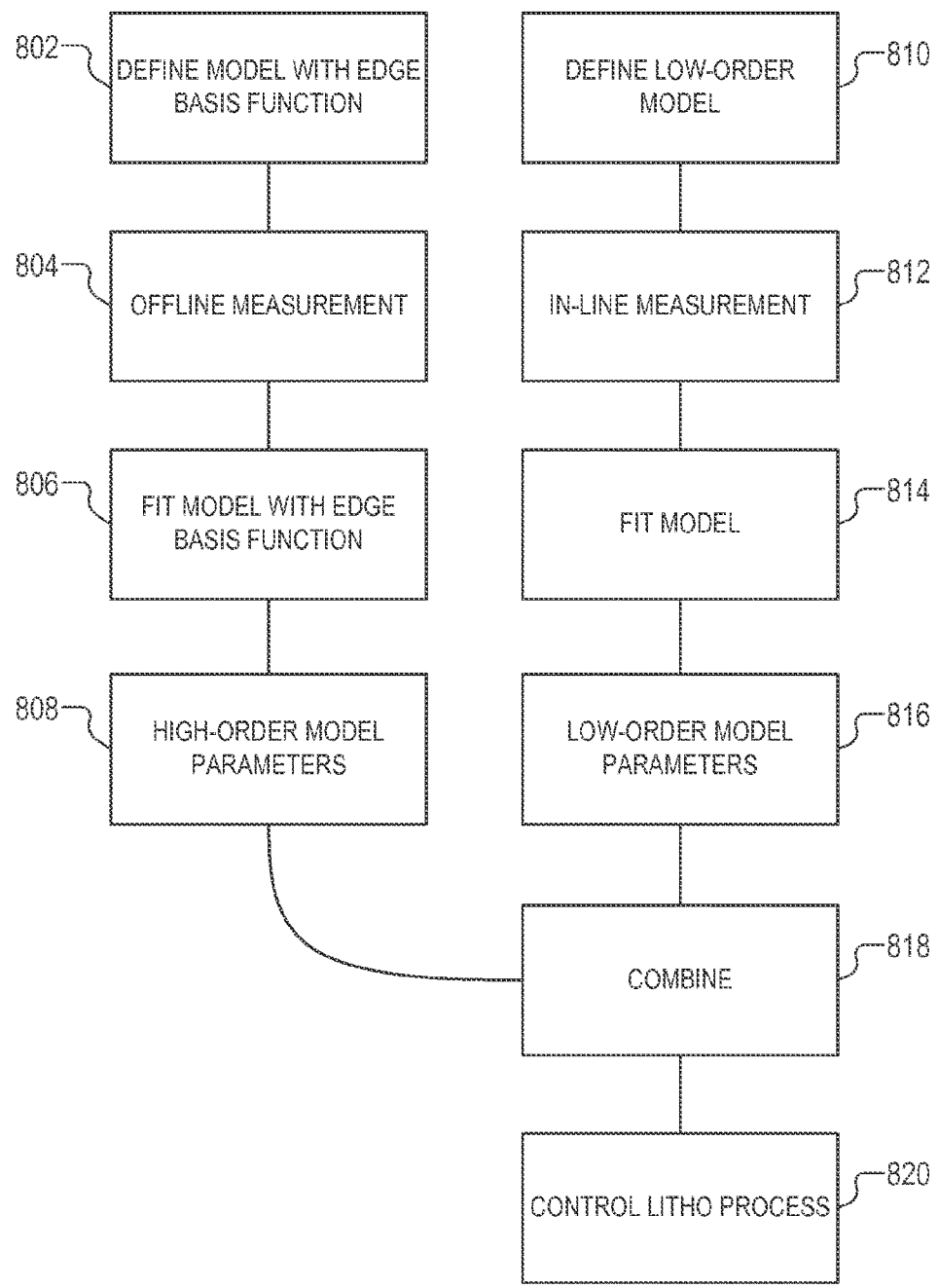
FIG. 8 illustrates a method of controlling lithographic processing in accordance with an embodiment of the present invention.

FIG. 8 illustrates a method of controlling lithographic processing using the techniques described above. The method is suitable for use in the production facility illustrated in FIG. 2 and the measurement and exposure process illustrated in FIG. 3.

In step 802, an extended high-order substrate model is defined using a combination of basis functions. The basis functions include at least one edge basis function for representing effects related to a substrate edge.

In step 804 offline metrology measurements of structures on substrates (220 in FIG. 2) that have been subjected to lithographic processing are performed using the metrology tool 240 of FIG. 2.

In step 806, the processor in the metrology tool receives the measurements and calculates high-order substrate model parameters 808 by fitting the measurements to the extended model defined in step 802. Standard regression techniques may be used. The edge basis function may be expressed in terms of distance from a substrate edge. The edge basis function may comprise a radial basis function. The edge basis function may comprise for example an exponential decay function or a rational function. The edge basis function may comprise both an exponential decay function and a rational function. However, since it is generally desirable to minimize the number of degrees of freedom down, using just one type of edge basis function is preferred. For an exponential decay edge basis function, the substrate model parameters may comprise an amplitude parameter of the exponential decay function and a decay range parameter of the exponential decay function. For a rational edge basis function, the substrate model parameters may comprise at least two shape constant parameters of the rational function. In either case, both the amplitude of the modeled edge effect and the degree to which it is localized at the substrate edge can be modeled very simply.

Steps 810 to 820 describe control of the lithographic processing of a subsequent substrate using the high-order substrate model parameters calculated in steps 802 to 808. Steps 810 to 820 are implemented in lithographic processing by the lithographic apparatus 200 shown in FIG. 2. The high-order substrate model parameters 808 may be passed to the lithographic apparatus 200, at 242 in FIG. 2. The high-order substrate model parameters may be included in the recipe 306 illustrated in FIG. 3.

At step 810, a low-order substrate model is defined, such as a conventional 6PAR model. At step 812 the measurement station MEA (202 in FIG. 2) performs inline measurements of structures on a subsequent substrate. A subsequent substrate is one that is subject to lithographic processing after the previous lithographic processing of the substrates on which the offline measurements 804 have been done. The inline measurements have a lower number of measurement points per substrate (i.e. density) than the offline metrology measurements.

At step 814, the processor in the lithography apparatus controller (LACU 206 in FIG. 2) calculates low-order substrate model parameters 816 by fitting the inline measurements to the low-order model defined in step 810. Standard regression techniques may be used.

In step 818 the high-order parameters 808 are combined with the low-order model parameters 816 in a conventional manner to define a high-order substrate model specific to the substrate being patterned.

At step 820, the processor in the lithography apparatus controller (LACU 206 in FIG. 2) controls lithographic processing of the subsequent substrate using the calculated high-order substrate model parameters 808 in combination 818 with the low-order substrate model parameters 816. This corresponds to the steps 314, 316 and 318 of FIG. 3.

There are several benefits that may be attained using the extended substrate model according to the principles disclosed herein. Benefits for the device manufacturer are yield improvement and more efficient preventive maintenance of equipment such as etchers.

Further advantages can be obtained when one recognizes that the edge effect parameters of the model effectively separate process and scanner contributions. The separation of the edge-related parameters in the substrate model provides an easy way for the system operator to enable or disable the correction of edge-related effects. The separation is useful because not all identified effects can be or should be corrected. The substrate model may represent disturbances in a selected direction, such as X or Y, by selectively enabling or disabling the correction of edge-related effects in each of the X and Y directions.

Defining a correction may be regarded as a permanent solution to the issues revealed by the analysis, or it may be that servicing or replacement of a responsible apparatus is required. Correction may be useful as a temporary measure until the responsible processing apparatus can be recalibrated or repaired. If the error is not correctable sufficiently, the apparatus in question may be omitted from processing (or reassigned to less critical operations).

In addition, it should be noted that to correct some types of error might make a performance parameter such as overlay worse, not better. This is because disturbances that remain consistent from layer to layer introduces no overlay error at all, whereas to identify such deviations and attempt to correct them in subsequent layers would introduce overlay. In additional to overlay between features in different layers of product features on a substrate, overlay may be defined as errors in relative placement of features within one layer, when performed by separate patterning steps. One example of such "multiple patterning" processes is a LELE (Litho-Etch-Litho-Etch) double patterning process. In such a case in which the overlay is measured between the second lithographic layer with respect to the first etched layer, both layers ultimately forming a single layer of (high density) product features in the functional device.

Having identified when certain edge effects should not be corrected, a simple indication of this can be stored as part of the alignment "recipe". The edge-related parameters can be ignored (set to zero) when calculating the corrections for each product unit (substrate).

Figure 9:
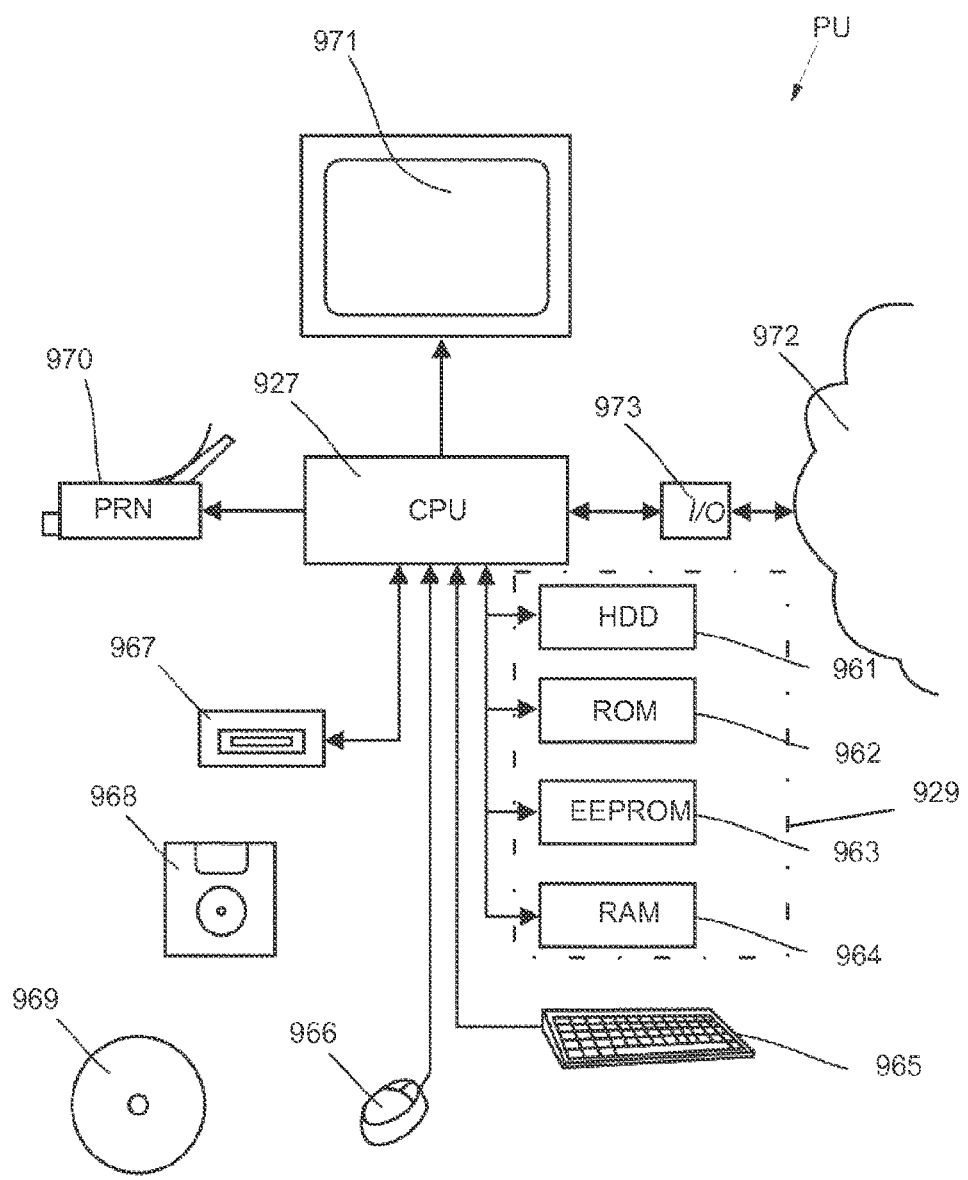
FIG. 9 illustrates schematically data processing hardware programmable to implement the apparatuses of the embodiments of the present invention.

The steps of the methods described above can be automated within any general purpose data processing hardware (computer), so long as it has access to the measurement data. The apparatus may be integrated with existing processors such as the lithography apparatus control unit LACU shown in FIG. 2 or an overall process control system. The hardware can be remote from the processing apparatus, even being located in a different country. Components of a suitable data processing apparatus (DPA) are shown in FIG. 9. The apparatus may be arranged for loading a computer program product comprising computer executable code. This may enable the computer assembly, when the computer program product is downloaded, to implement the functions of the PCA apparatus and/or RCA apparatus as described above.

With reference to FIG. 9, memory 929 connected to processor 927 may comprise a number of memory components like a hard disk 961, Read Only Memory (ROM) 962, Electrically Erasable Programmable Read Only Memory (EEPROM) 963 and Random Access Memory (RAM) 964. Not all aforementioned memory components need to be present. Furthermore, it is not essential that aforementioned memory components are physically in close proximity to the processor 927 or to each other. They may be located at a distance away The processor 927 may also be connected to some kind of user interface, for instance a keyboard 965 or a mouse 966. A touch screen, track ball, speech converter or other interfaces that are known to persons skilled in the art may also be used.

The processor 927 may be connected to a reading unit 967, which is arranged to read data, e.g. in the form of computer executable code, from and under some circumstances store data on a data carrier, like a floppy disc 968 or a CDROM 969. Also DVD's or other data carriers known to persons skilled in the art may be used.

The processor 927 may also be connected to a printer 970 to print out output data on paper as well as to a display 971, for instance a monitor or LCD (Liquid Crystal Display), of any other type of display known to a person skilled in the art.

The processor 927 may be connected to a communications network 972, for instance a public switched telephone network (PSTN), a local area network (LAN), a wide area network (WAN) etc. by means of transmitters/receivers 973 responsible for input/output (I/O). The processor 927 may be arranged to communicate with other communication systems via the communications network 972. In an embodiment, external computers (not shown), for instance personal computers of operators, can log into the processor 927 via the communications network 972.

The processor 927 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 927 may even be located a distance away of the other processing units and communicate via communications network 972. Connections between modules can be made wired or wireless.

The computer system can be any signal processing system with analogue and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. As already mentioned, an embodiment of the invention may be applied in industrial processing applications quite separate from lithography. Examples might be in production of optical components, automotive manufacture, construction—any number of applications where object data exists in the form of measurements made with a certain spatial distribution over the product. As in the example of lithography. Although specific reference may have been made above to the use of embodiments of the invention in the context of optical lithography, it will be appreciated that an embodiment of the invention may be used in other types of lithography, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims appended hereto. In addition, it should be appreciated that structural features or method steps shown or described in any one embodiment herein can be used in other embodiments as well.

Aspects of the concept of the invention are summarized below in some clauses:

1. A method of calculating a substrate model for use in controlling a lithographic process, the method comprising:

defining a substrate model for representing disturbances of features on substrate to which patterns are to be applied by the lithographic process, the substrate model being defined as a combination of predefined basis functions;

receiving measurements of structures on at least one substrate; and calculating substrate model parameters using the measurements and the basis functions, wherein the basis functions include at least one edge basis function for representing effects related to a substrate edge.

2. The method of clause 1, wherein the edge basis function decreases monotonically with increasing distance from a substrate edge.

3. The method of clause 1 or clause 2, wherein the substrate is of generally circular form, and the edge basis function comprises a radial basis function.
4. The method of clause 1 or clause 2, wherein the substrate model parameters comprise two parameters related to the edge basis function or edge basis functions.
5. The method of clause 1 or clause 2, wherein the substrate model represents disturbances in a selected direction in the plane of the substrate.
6. An apparatus for calculating a substrate model for use in controlling a lithographic process, the apparatus comprising a data processing apparatus programmed to perform the steps of:
defining a substrate model for representing disturbances of features on substrate to which patterns are to be applied by the lithographic process, the substrate model being defined as a combination of predefined basis functions;
receiving measurements of structures on at least one substrate; and
calculating substrate model parameters using the measurements and the basis functions,
wherein the basis functions include at least one edge basis function for representing effects related to a substrate edge.
7. The apparatus of clause 6, wherein the edge basis function decreases monotonically with increasing distance from a substrate edge.
8. The apparatus of clause 6 or clause 7, wherein the substrate is of generally circular form, and the edge basis function comprises a radial basis function.
9. The apparatus of clause 8, wherein the substrate model parameters comprise two parameters related to the edge basis function or edge basis functions.
10. The apparatus of clause 6 or clause 7, wherein the substrate model is defined for representing disturbances in a selected direction in the plane of the substrate.
11. The apparatus of any of clause 6 or clause 7, wherein the edge basis function can be selectively enabled or disabled.
12. A method of controlling lithographic processing in which patterns are applied to substrates, the method comprising:
receiving first measurements of structures on substrates that have been subjected to lithographic processing;
using the first measurements of disturbances to calculate first substrate model parameters using a method as specified in any of clauses 1 to 5; and
controlling lithographic processing of a subsequent substrate using the calculated first substrate model parameters.
13. The method of controlling lithographic processing of clause 12, wherein the step of controlling lithographic processing of the subsequent substrate comprises:
receiving second measurements of disturbances on the subsequent substrate, the second measurements having a lower number per substrate than the first measurements;
using the second measurements to calculate second substrate model parameters of the subsequent substrate using a model having a lower order than a model used to calculate the first substrate model parameters; and
controlling lithographic processing of the subsequent substrate using the calculated first substrate model parameters in combination with the second substrate model parameters.
14. The method of clause 12 or clause 13 wherein the step of controlling lithographic processing includes selectively enabling or disabling use of substrate model parameters related to the edge basis function.
15. An apparatus for controlling lithographic processing in which substrates are subjected to lithographic processing, the apparatus comprising a data processing apparatus programmed to perform the steps of:
receiving first measurements of disturbances on substrates that have been subjected to lithographic processing;
using the first measurements to calculate first substrate model parameters using a method as specified in any of clauses 1 to 5; and
controlling lithographic processing of a subsequent substrate using the calculated first substrate model parameters.
16. The apparatus of clause 15, wherein for controlling lithographic processing of the subsequent substrate the data processing apparatus is programmed to perform the steps of:
receiving second measurements of disturbances on the subsequent substrate, the second measurements having a lower number per substrate than the first measurements;
using the second measurements to calculate second substrate model parameters of the subsequent substrate using a model having a lower order than a model used to calculate the first substrate model parameters; and
controlling lithographic processing of the subsequent substrate using the calculated first substrate model parameters in combination with the second substrate model parameters.
17. The apparatus of clause 15 or clause 16 wherein for controlling lithographic processing the data processing apparatus is arranged to selectively enable or disable use of substrate model parameters related to the edge basis function.
18. A computer program product comprising machine readable instructions for causing a general purpose data processing apparatus to perform the steps of a method as specified in any of clauses 1 to 5 or 12 to 14.
19. A computer program product as specified in clause 18 further comprising machine readable instructions for causing the data processing apparatus to implement an apparatus as specified in any of clauses 6 to 11 or 15 to 17.

The invention claimed is:
1. A method comprising:
obtaining a substrate model for representing a substrate to which patterns are to be applied by a lithographic process, the substrate model defined as a combination of a first model and a second model, the first model defined as a first combination of basis functions, the second model defined as a second combination of basis functions comprising an edge basis function;
receiving first measurements of structures on a first at least one previous substrate, other than or in addition to the substrate;
determining, by a hardware computer system, one or more parameters of the first model using the first measurements and the first basis functions;
receiving second measurements of structures on a second at least one previous substrate, other than or in addition to the substrate; and
determining, by the hardware computer system, one or more parameters of the second model using the second measurements and the second basis functions,
wherein the first measurements are obtained by inline measurement and the second measurements are obtained by offline measurement.
2. The method of claim 1, wherein the first model comprises a lower order model than the second model.
3. The method of claim 1, wherein the inline measurement involves a metrology system inside an apparatus used in applying patterns to substrates and the offline measurement involves a metrology system outside an apparatus used in applying patterns to substrates.

4. A computer program product comprising a non-transitory computer-readable medium having machine readable instructions therein, the instructions, upon execution by a computer system, configured to cause the computer system to at least:
   obtain a substrate model for representing a substrate to which patterns are to be applied by a lithographic process, the substrate model defined as a combination of a first model and a second model, the first model defined as a first combination of basis functions, the second model defined as a second combination of basis functions comprising an edge basis function;
   receive first measurements of structures on a first at least one previous substrate, other than or in addition to the substrate, the first measurements obtained by inline measurement;
   determine one or more parameters of the first model using the first measurements and the first basis functions;
   receive second measurements of structures on a second at least one previous substrate, other than or in addition to the substrate, the second measurements obtained by offline measurement; and
   determine one or more parameters of the second model using the second measurements and the second basis functions.

5. The computer program product of claim 4, wherein the first model comprises a lower order model than the second model.

6. The computer program product of claim 4, wherein the edge basis function decreases monotonically with increasing distance from a substrate edge.

7. The computer program product of claim 4, wherein the substrate is of generally circular form, and the edge basis function comprises a radial basis function.

8. The computer program product of claim 4, wherein the second model comprises two parameters related to the edge basis function.

9. The computer program product of claim 4, wherein the substrate model is defined to represent disturbances in a selected direction in the plane of the substrate.

10. The computer program product of claim 4, wherein the edge basis function can be selectively enabled or disabled.

11. The computer program product of claim 4, wherein the inline measurement involves a metrology system inside an apparatus used in applying patterns to substrates and the offline measurement involves a metrology system outside an apparatus used in applying patterns to substrates.

12. An apparatus for controlling lithographic processing in which substrates are subjected to lithographic processing, the apparatus comprising:
   a computer system; and
   the computer program product of claim 4.

13. A computer program product comprising a non-transitory computer-readable medium having machine readable instructions therein, the instructions, upon execution by a computer system, configured to cause the computer system to at least:
   obtain a substrate model for representing a performance parameter for a substrate to which patterns are to be applied by a lithographic process, the substrate model defined as a combination of a first model and a second model, the first model defined as a first combination of basis functions, the second model defined as a second combination of basis functions and the first model having a lower order than the second model;
   receive first measurements of the performance parameter for a first at least one previous substrate, other than or in addition to the substrate, the first measurements obtained by inline measurement;
   determine one or more parameters of the first model using the first measurements and the first basis functions;
   receive second measurements of the performance parameter for a second at least one previous substrate, other than or in addition to the substrate, the second measurements obtained by offline measurement; and
   determine one or more parameters of the second model using the second measurements and the second basis functions.

14. The computer program product of claim 13, wherein the substrate model comprises an edge basis function and the edge basis function decreases monotonically with increasing distance from a substrate edge.

15. The computer program product of claim 13, wherein the substrate model comprises an edge basis function, the substrate is of generally circular form, and the edge basis function comprises a radial basis function.

16. The computer program product of claim 13, wherein the performance parameter is overlay, alignment, critical dimension, line thickness, focus, or dose.

17. The computer program product of claim 13, wherein the substrate model is defined to represent disturbances in a selected direction in the plane of the substrate.

18. The computer program product of claim 13, wherein the substrate model comprises an edge basis function and the edge basis function can be selectively enabled or disabled.

19. The computer program product of claim 13, wherein the inline measurement involves a metrology system inside an apparatus used in applying patterns to substrates and the offline measurement involves a metrology system outside an apparatus used in applying patterns to substrates.

20. An apparatus for controlling lithographic processing in which substrates are subjected to lithographic processing, the apparatus comprising:
   a computer system; and
   the computer program product of claim 13.

* * * * *

UNITED STATES PATENT AND TRADEMARK OFFICE
CERTIFICATE OF CORRECTION

PATENT NO. : 11,300,891 B2
APPLICATION NO. : 17/111050
DATED : April 12, 2022
INVENTOR(S) : Jasper Menger et al.

It is certified that error appears in the above-identified patent and that said Letters Patent is hereby corrected as shown below:

On the Title Page

Item (63) Related U.S. Application Data:
Please correct "Continuation of application No. 16/665,022, filed on Oct. 28, 2018" to "Continuation of application No. 16/665,022, filed on Oct. 28, 2019"

Signed and Sealed this
Twenty-third Day of August, 2022

Katherine Kelly Vidal
*Director of the United States Patent and Trademark Office*